United States Patent
Fain et al.

(10) Patent No.: US 10,677,874 B2
(45) Date of Patent: Jun. 9, 2020

(54) SYSTEM AND METHOD FOR CONTROL OF HYPERPOLARIZED GAS-PHASE CONTAMINATION IN SPECTROSCOPIC MAGNETIC RESONANCE IMAGING

(71) Applicant: Wisconsin Alumni Research Foundation, Madison, WI (US)

(72) Inventors: Sean Fain, Madison, WI (US); Andrew Hahn, Madison, WI (US); Jeffrey Kammerman, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 290 days.

(21) Appl. No.: 15/900,256

(22) Filed: Feb. 20, 2018

(65) Prior Publication Data

US 2019/0257907 A1   Aug. 22, 2019

(51) Int. Cl.
*G01R 33/565* (2006.01)
*G01R 33/28* (2006.01)
(Continued)

(52) U.S. Cl.
CPC ..... *G01R 33/56527* (2013.01); *G01R 33/282* (2013.01); *G01R 33/543* (2013.01);
(Continued)

(58) Field of Classification Search
CPC .......... G01R 33/56527; G01R 33/5601; G01R 33/282; G01R 33/543; G01R 33/5608;
(Continued)

(56) References Cited

U.S. PATENT DOCUMENTS

| 2001/0041834 A1* | 11/2001 | Mugler, III | G01R 33/5601 600/420 |
| 2002/0037251 A1* | 3/2002 | Driehuys | A61B 5/02755 424/9.3 |

(Continued)

OTHER PUBLICATIONS

Rao, M., Stewart, N.J., Norquay, G., Griffiths, P.D. and Wild, J.M., 2016. High resolution spectroscopy and chemical shift imaging of hyperpolarized 129Xe dissolved in the human brain in vivo at 1.5 tesla. Magnetic resonance in medicine, 75(6), pp. 2227-2234. (Year: 2016).*

Cleveland, Z.I., Cofer, G.P., Metz, G., Beaver, D., Nouls, J., Kaushik, S.S., Kraft, M., Wolber, J., Kelly, K.T., McAdams, H.P. and Driehuys, B., 2010. Hyperpolarized 129Xe MR imaging of alveolar gas uptake in humans. PloS one, 5(8). (Year: 2010).*

(Continued)

*Primary Examiner* — Christopher P McAndrew
(74) *Attorney, Agent, or Firm* — Quarles & Brady LLP

(57) ABSTRACT

A system and method is provided to acquire images of a subject having received a tissue soluble hyperpolarized gas into the airways. The method includes performing a pulse sequence including (i) for each effective repetition time (TReff), acquiring at least one gas-phase dataset and at least one dissolved-phase dataset, wherein a gas-phase echo time (TEGas) of the at least one gas-phase dataset and a dissolved-phase echo time (TEDissolved) of the at least one dissolved-phase dataset are selected to isolate gas-phase contamination of the dissolved-phase dataset from dissolved-phase components in the dissolved-phase dataset. The method also includes (ii) estimating gas-phase contamination of the dissolved-phase dataset using the gas-phase dataset and a scaling factor ($\sigma$), (iii) producing a corrected dissolved-phase dataset by reducing the gas-phase contamination of the dissolved-phase dataset using the gas-phase contamination estimated in step (ii), and reconstructing an image from the corrected dissolved-phase dataset and the gas-phase dataset.

22 Claims, 9 Drawing Sheets
(6 of 9 Drawing Sheet(s) Filed in Color)

(51) Int. Cl.
*G01R 33/54* (2006.01)
*G01R 33/56* (2006.01)
*G01R 33/385* (2006.01)
*G01R 33/48* (2006.01)

(52) U.S. Cl.
CPC ........ *G01R 33/5601* (2013.01); *G01R 33/385* (2013.01); *G01R 33/4824* (2013.01); *G01R 33/4828* (2013.01); *G01R 33/5608* (2013.01)

(58) Field of Classification Search
CPC ............ G01R 33/4828; G01R 33/4824; G01R 33/385
USPC ........................................................ 324/309
See application file for complete search history.

(56) References Cited

U.S. PATENT DOCUMENTS

| | | | | |
|---|---|---|---|---|
| 2002/0094317 | A1* | 7/2002 | Pines | A61K 49/1815 424/9.3 |
| 2003/0064023 | A1* | 4/2003 | Driehuys | A61B 5/055 424/9.3 |
| 2004/0005273 | A1* | 1/2004 | Driehuys | A61B 5/055 424/9.3 |
| 2004/0039281 | A1* | 2/2004 | Cook | A61K 49/10 600/420 |
| 2004/0066193 | A1* | 4/2004 | Ardenkjaer-Larsen | G01R 33/282 324/309 |
| 2007/0225592 | A1* | 9/2007 | Ruppert | A61B 5/0515 600/420 |
| 2008/0089846 | A1* | 4/2008 | Driehuys | A61B 5/055 424/9.3 |

OTHER PUBLICATIONS

Driehuys, B., Cofer, G.P., Pollaro, J., Mackel, J.B., Hedlund, L.W. and Johnson, G.A., 2006. Imaging alveolar—capillary gas transfer using hyperpolarized 129Xe MRI. Proceedings of the National Academy of Sciences, 103(48), pp. 18278-18283. (Year: 2006).*

Hahn, A., Magnetic A., et al., "Removal of hyperpolarized 129Xe gas-phase contamination in spectroscopic imaging of the lungs." Magnetic resonance in medicine 80.6 (2018): 2586-2597.

Kammerman, J., et al., Dissolved phase Hyperpolalized Xenon-129 pulmonary imaging in the presence of gaseous Xenon signal, ISMRM Convention, 2017, Honolulu HI.

Kaushik, et al., Single-Breath Clinical Imaging of Hyperpolarized 129Xe in the Airspaces, Barrier and Red Blood Cells using an Interleaved 3D Radial 1-point Dixon Acquisition. Magn Reson Med. 2016; 75(4):1434-1443.

Ansari AR, Bradley RA. Rank-sum tests for dispersions. Ann Math Statist. 1960; 31(4):1174-1189.

Chen RY, et al., Tissue-blood partition coefficient for xenon: temperature and hematocrit dependence. J Appl Physiol 1980; 49(2):178-183.

Cleveland ZI, et al (2010) Hyperpolarized 129Xe MR Imaging of Alveolar Gas Uptake in Humans. PLoS One 5: e12192. doi: 10.1371/journal.pone.0012192.

Dixon WT. Simple proton spectroscopic imaging. Radiology 1984; 153(1):189-194.

Driehuys B, et al (2006) Imaging alveolar-capillary gas transfer using hyperpolarized 129Xe MRI. Proc Natl Acad Sci U S A 103:18278-18283. doi: 10.1073/pnas.0608458103.

Driehuys B, et al., High-volume production of laser-polarized Xe-129. Apply Phys Lett. 1996; 69:1668-1670.

Driehuys B, et al., Chronic Obstructive Pulmonary Disease: Safety and Tolerability of Hyperpolarized Xe-129 MR Imaging in Healthy Volunteers and Patients. Radiology 2012; 262(1):279-289.

Ebner L, et al., The role of hyperpolarizednon in MR imaging of pulmonary function. Eur J Radiol 2017; 86:343-352.

Jackson J, et al., Selection of a convolution function for Fourier inversion using gridding. IEEE Trans Med Imaging. 1991; 10:473-478.

Kaushik SS, et al., Measuring Diffusion-Limitation with a Perfusion-Limited Gas-Flyperpolarized 129Xe Gas-Transfer Spectroscopy in Patients with Idiopathic Pulmonary Fibrosis. J Appl Physiol. 2014; 117:577-585.

Kaushik SS, et al., Probing the regional distribution of pulmonary gas exchange through single-breath gas- and dissolved-phase 129Xe MR imaging. J. Appl. Physiol. 2013; 115:850-860.

Leung G, et al., Radiofrequency Pulse Design for the Selective Excitation of Dissolved 129Xe. Magn Reson Med. 2015; 73:21-30.

Mugler, JP. et al., Image-based measurement of T2* for dissolved-phase Xe129 in the human lung; Proceedings of the International Society for Magnetic Resonance in Medicine; Melbourne, Australia. 2012.

Pipe JG, et al., Sampling density compensation in MRI: rationale and an iterative numerical solution. Magn Reson Med. 1999; 41:179-186.

Qing K, et al., Regional mapping of gas uptake by blood and tissue in the human lung using hyperpolarized xenon-129 MRI. J Magn Reson Imaging. 2014; 39(2):346-359.

Reeder SB, et al., Water-fat separation with IDEAL gradient-echo imaging. J Magn Reson Imaging 2007; 25(3):644-52.

Shea, DA. et al., The Helium-3 Shortage: Supply, Demand, and Options for Congress; CRS Report for Congress 2010.

Shinnar M, et al., The use of finite impulse response filters in pulse design. Magneton Reson Med. 1989; 12:75-87.

Wang Z, et al., Quantitative analysis of hyperpolarized 129Xe gas transfer MRI. Med Phys. 2017; 44(6):2415-2428.

Xu X, et al., Hyperpolarized 129Xe Gas Lung MRI-SNR and T2* Comparisons at 1.5 T and 3 T. Magn Reson Med. 2012; 68:1900-1904.

* cited by examiner

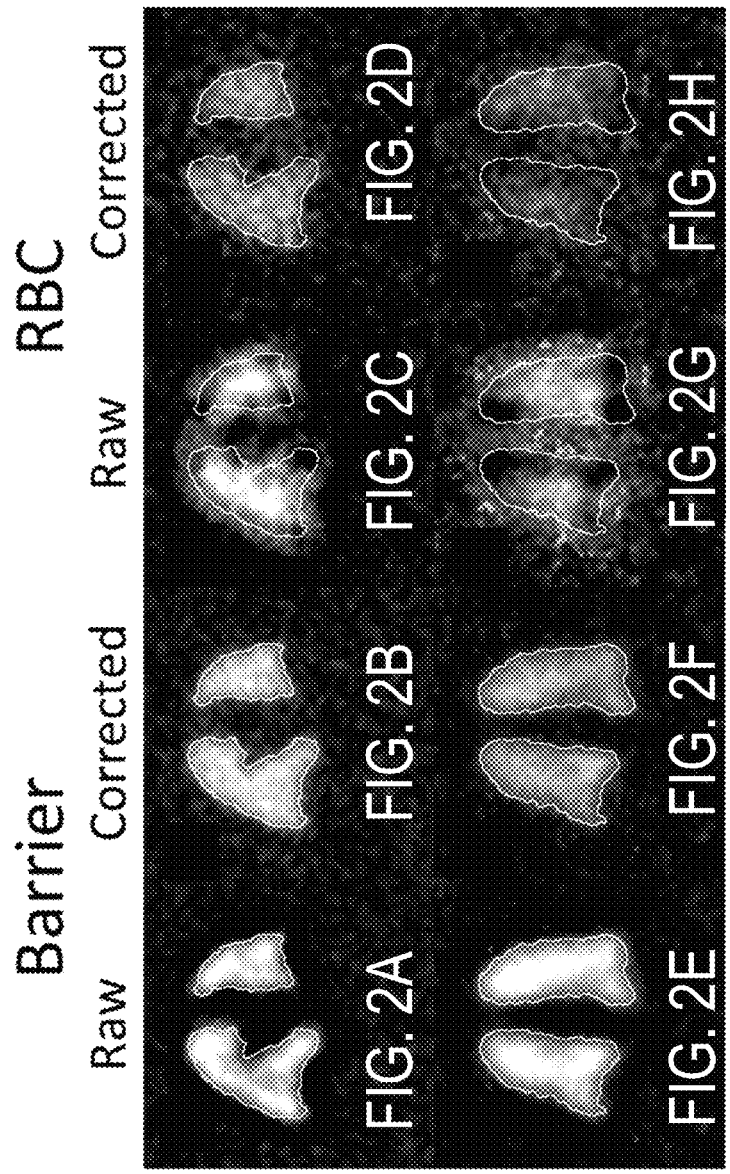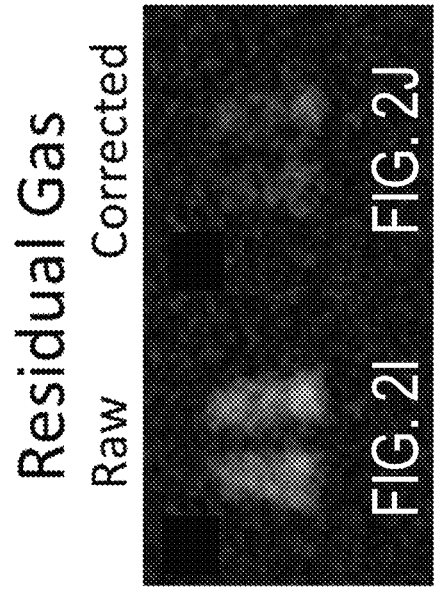

Barrier-to-gas

RBC-to-gas

SYSTEM AND METHOD FOR CONTROL OF HYPERPOLARIZED GAS-PHASE CONTAMINATION IN SPECTROSCOPIC MAGNETIC RESONANCE IMAGING

STATEMENT REGARDING FEDERALLY SPONSORED RESEARCH

This invention was made with government support under HL126771 awarded by the National Institutes of Health. The government has certain rights in the invention.

BACKGROUND

The present disclosure relates generally to systems and methods for magnetic resonance imaging ("MRI"). More particularly, the disclosure relates to systems and methods for controlling gas-phase contamination in spectroscopic MRI.

MRI uses the nuclear magnetic resonance ("NMR") phenomenon to produce images. When a substance such as human tissue is subjected to a uniform magnetic field, such as the so-called main magnetic field, $B_0$, of an MRI system, the individual magnetic moments of the nuclei in the tissue attempt to align with this $B_0$ field, but precess about it in random order at their characteristic Larmor frequency, $\ell_0$. If the substance, or tissue, is subjected to a so-called excitation electromagnetic field, $B_1$, that is in the plane transverse to the $B_0$ field and that has a frequency near the Larmor frequency, the net aligned magnetic moment, referred to as longitudinal magnetization, may be rotated, or "tipped," into the transverse plane to produce a net transverse magnetic moment, referred to as transverse magnetization. A signal is emitted by the excited nuclei or "spins," after the excitation field, $B_1$, is terminated, and this signal may be received and processed to form an image.

Hyperpolarized gases, such as Xenon-129 (HP 129Xe), can be used in conjunction with MRI to perform techniques for investigating pulmonary function. One of the most attractive properties of HP 129Xe is its solubility in both parenchymal lung tissue and blood plasma (TP), and red blood cells (RBC), collectively referred to as the "dissolved phase" components. HP 129Xe in these compartments experiences a unique chemical shift relative to the gas phase; the TP phase is shifted by 198 ppm, while the RBC phase is shifted by 217 ppm. These shifts provide a means for probing regional pulmonary gas exchange using established multi-spectral MRI techniques such as 1-point Dixon or iterative decomposition with echo asymmetry and least-squares estimation (IDEAL) based approaches.

Though it is possible to image HP 129Xe dissolved phase components in theory, such imaging techniques are difficult to implement in a manner that is suitable for clinical needs. For example, the HP 129Xe dissolved phase components exhibit a short $T_2^*$ (e.g., ~2 ms at 1.5 T) and a relatively small signal (e.g., 1-2% of the gas phase HP 129Xe). These challenges have typically been overcome by utilizing radial or spiral k-space trajectories to minimize echo time (TE) and spectrally selective excitation of the dissolved phase. Ideally, selective excitation is needed to conserve HP magnetization and isolate the TP and RBC components from the large gas phase reservoir. However, in practice, gas phase contamination of the dissolved phase signal remains a substantial issue due to tradeoffs between RF pulse profile, amplifier performance, and echo time.

Any contamination by the gas-phase xenon is generally undesirable; gas contamination of the dissolved-phase components presents a substantial confounding factor for spectral techniques such as Dixon-based methods and multi-echo IDEAL separation approaches in functional imaging of the lungs. Measures of gas exchange using HP 129Xe depend on ratios standardized to the gas signal in the alveolar space, and therefore depend on accurate separation of TP and RBC from the gas signal component. In order to utilize a 1-point Dixon separation strategy, a two-component model (i.e., TP and RBC signal only) can be utilized. Of course, in such a two-compartment model, the presence of gas contamination signal not accounted for and can induce errors in the dissolved-component separation, which can cause severe image artifacts. Separation approaches based on IDEAL can, in general, model three separate components. However, the large frequency shift between the gaseous and dissolved HP 129Xe phases (~3832 Hz at 1.5 T) in conjunction with non-Cartesian k-space trajectories utilized to minimize TE results in point spread function related spatial aliasing that leads to violations of certain necessary assumptions made by the IDEAL multi-component signal model.

As such, some have tried to create carefully-designed and calibrated RF pulses to restrict excitation to just the dissolved phase components, thus minimizing confounding gas contamination. While calibration methods are technically feasible, they are often empirical and sufficiently effective only in a restricted range of RF pulse performance. For example, calibration techniques typically seek to shift the gas phase frequency to a local null in the RF pulse stop band, but such approaches depend upon the stability and linearity of a given RF amplifier. It is also hard to predict precise hardware performance across sites and vendors or even between different machines at the same site. It also requires careful characterization and design of pulses for each specific application.

Therefore, it would be desirable to reduce or substantially eliminate the significant influence of RF pulse performance and behavior to simplify technical development of HP 129Xe applications and allow reliable methodological dissemination across sites and hardware vendors.

SUMMARY

The present disclosure overcomes the aforementioned drawbacks by providing systems and methods that for estimating and controlling the influence of gas-phase xenon contamination in dissolved-phase HP 129Xe data. The provided dissolved-phase HP 129Xe acquisition methodology includes acquiring data at multiple echo times. In accordance with the present disclosure, such additional acquisitions need not extend the overall acquisition time (i.e., same initial TE, same TR, same total imaging time, etc.). The present techniques leverage the short $T_2^*$ of the dissolved-phase xenon and long $T_2^*$ of the gas-phase xenon relative to the longer TE. Thus, at a sufficiently long TE, contaminated dissolved-phase data can be substantially isolated from the gas signal, and the gas contribution can be estimated, controlled, or even effectively removed.

In accordance with one aspect of the disclosure, a method is provided for operating a magnetic resonance imaging (MRI) system to acquire images of a subject having received a hyperpolarized gas into airways. The method includes performing a pulse sequence including (i) for each effective repetition time (TReff), acquiring at least one gas-phase dataset and at least one dissolved-phase dataset, wherein a gas-phase echo time (TEGas) of the at least one gas-phase dataset and a dissolved-phase echo time (TEDissolved) of the at least one dissolved-phase dataset are selected to isolate gas-phase contamination of the dissolved-phase dataset from dissolved-phase components in the dissolved-phase dataset. The method also includes (ii) estimating gas-phase contamination of the dissolved-phase dataset using the gas-phase dataset and a scaling factor (σ), (iii) producing a corrected dissolved-phase dataset by reducing the gas-phase contamination of the dissolved-phase dataset using the gas-phase contamination estimated in step (ii), and reconstructing an image from the corrected dissolved-phase dataset and the gas-phase dataset.

In accordance with another aspect of the disclosure, a magnetic resonance imaging (MRI) system is provided that includes a magnet system configured to generate a static magnetic field about at least a portion of a subject arranged in the MRI system and a gradient system configured to establish at least one magnetic gradient field with respect to the static magnetic field. The system also includes a radio frequency (RF) system configured to deliver excitation pulses to the subject and acquire imaging data from the subject and a computer system. The computer system is programmed to control the gradient system and the RF system to perform a pulse sequence. The pulse sequence includes (i) for each effective repetition time ($TR_{eff}$), acquiring at least one gas-phase dataset and at least one dissolved-phase dataset, wherein a gas-phase echo time ($TE_{Gas}$) of the at least one gas-phase dataset and a dissolved-phase echo time ($TE_{Dissolved}$) of the at least one dissolved-phase dataset are selected to isolate gas-phase contamination from dissolved-phase components in the dissolved-phase dataset. The computer is further configured to (ii) estimate gas-phase contamination of the dissolved-phase dataset using the gas-phase dataset and a scaling factor (σ) and (iii) produce a corrected dissolved-phase dataset by reducing the gas-phase contamination of the dissolved-phase dataset using the gas-phase contamination estimated in step (ii). The computer system is programmed to reconstruct an image of airspaces, TP, and RBC, of the subject from the corrected dissolved-phase dataset and the gas-phase dataset.

In accordance with yet another aspect of the disclosure, a method is provided for operating a magnetic resonance imaging (MRI) system to acquire images of hyperpolarized gas. The method includes performing a pulse sequence including steps comprising (i) acquiring at least one gas-phase dataset using a gas-phase echo time (TEGas), (ii) acquiring a dissolved-phase dataset at a dissolved-phase echo time (TEDissolved) selected to isolate gas-phase contamination from dissolved-phase components in the dissolved-phase dataset, and (iii) repeating steps (i) and (ii) a plurality of times to complete the gas-phase dataset and the dissolved-phase dataset. The method further includes (iv) estimating gas-phase contamination of the dissolved-phase dataset using the gas-phase dataset and a scaling factor (σ) and (v) producing a corrected dissolved-phase dataset by reducing the gas-phase contamination of the dissolved-phase dataset using the gas-phase contamination estimated in step (iii). The method includes reconstructing an image of airspaces of the subject from the corrected dissolved-phase dataset and the gas-phase dataset.

The foregoing and other aspects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIG. 2A is an image showing a single central slice of raw barrier signal, separated with a single point Dixon technique, from a simulation in accordance with the present disclosure where the outline of the lung volume is shown.

FIG. 2B is an image showing a single central slice of corrected barrier signal, separated with a single point Dixon technique, from a simulation in accordance with the present disclosure where the outline of the lung volume is shown.

FIG. 2C is an image showing a single central slice of raw RBC signal, separated with a single point Dixon technique, from a simulation in accordance with the present disclosure where the outline of the lung volume is shown and artifacts due to contaminant gas signal are visible.

FIG. 2D is an image showing a single central slice of corrected RBC signal, separated with a single point Dixon technique, from a simulation in accordance with the present disclosure where the outline of the lung volume is shown and artifacts due to contaminant gas signal are no longer present.

FIG. 2E is an image showing a single central slice of raw barrier signal, separated with a single point Dixon technique, from a human experiment in accordance with the present disclosure where the outline of the lung volume is shown.

FIG. 2F is an image showing a single central slice of corrected barrier signal, separated with a single point Dixon technique, from a human experiment in accordance with the present disclosure where the outline of the lung volume is shown.

FIG. 2G is an image showing a single central slice of raw RBC signal, separated with a single point Dixon technique, from a human experiment in accordance with the present disclosure where the outline of the lung volume is shown and artifacts due to contaminant gas signal are visible.

FIG. 2H is an image showing a single central slice of corrected RBC signal, separated with a single point Dixon technique, from a human experiment in accordance with the present disclosure where the outline of the lung volume is shown and artifacts due to contaminant gas signal are no longer present.

FIG. 2I is an image showing residual gas contamination before correction for the human subject experiment of FIGS. 2E-2H, showing dissolved-phase images from TE2 modulated to be on the gas resonance.

FIG. 2J is an image showing residual gas contamination after correction for the human subject experiment of FIGS. 2E-2H, showing dissolved-phase images from TE2 modulated to be on the gas resonance.

DETAILED DESCRIPTION

Dissolved-phase hyperpolarized Xenon-129 imaging shows promise as a means to evaluate gas transfer from the airspaces of the lungs to parenchymal tissue and the blood stream. The short $T_2^*$ of dissolved-phase Xenon requires the use of short RF pulses, reducing the spectral selectivity possible. This often leads to the excitation of gas-phase Xenon while imaging the dissolved-phase. The present disclosure provides a system and method to selectively remove gas-phase contamination from dissolved-phase images. The correction utilizes simultaneous acquisition of multi-TE gas- and dissolved-phase images, with echo times selected to facilitate the separation of the dissolved-phase tissue and plasma (TP) and red blood cell (RBC) components of the dissolved-phase signal. This system and method recognizes 1) that the gas-phase contamination of the dissolved-phase may be estimated from gas-only data multiplied by a complex scale factor and modulated by the known off-resonance frequency and 2) that the resonant frequencies and $T_2^*$ values for the TP and RBC components can be determined either by prior measurements or assumed from literature values. Thus, gas-phase contamination, dissolved-phase RBC component, and dissolved-phase TP component are simultaneously estimated through an iterative least-squares fit.

Figure 1A:
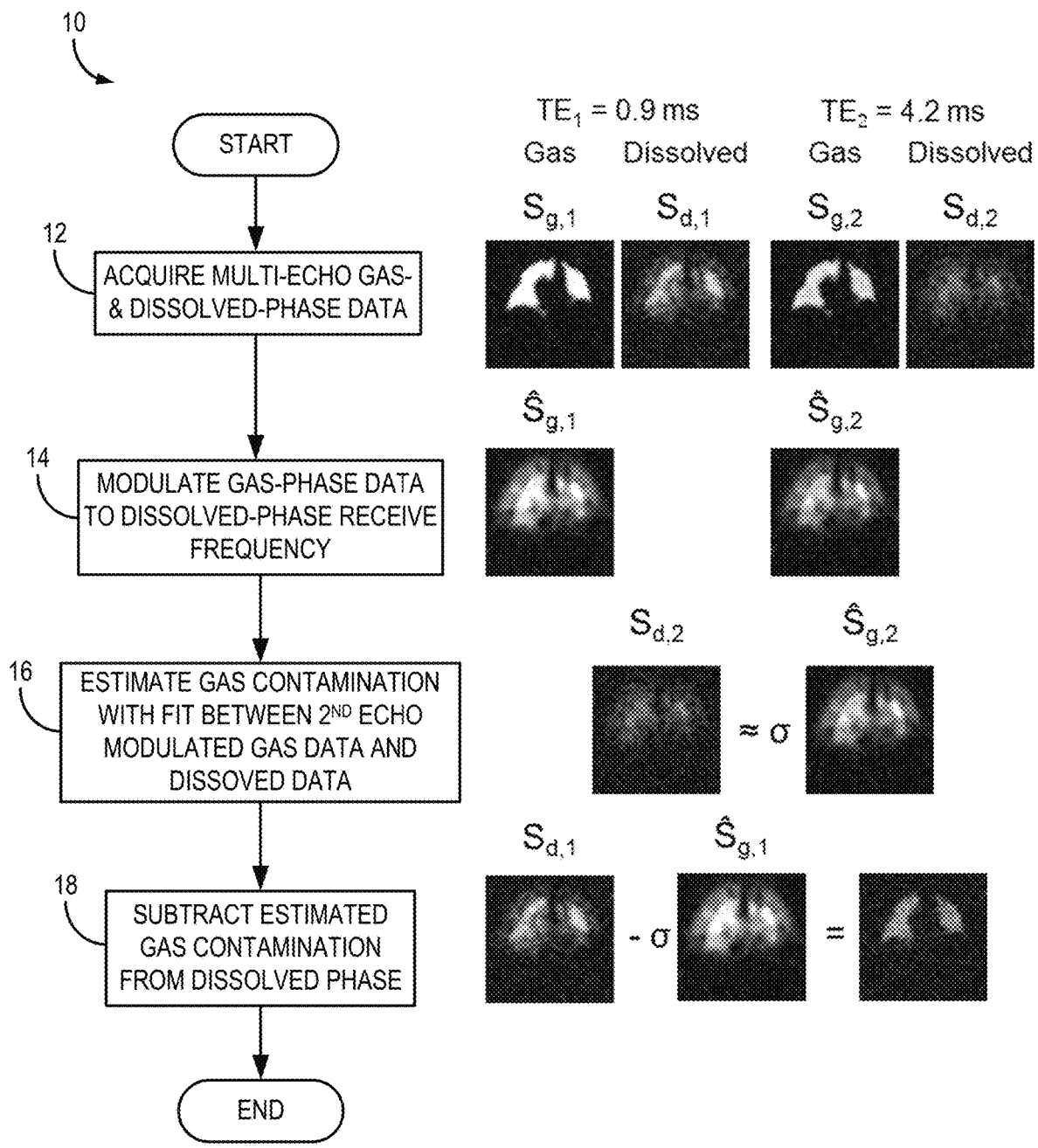
FIG. 1A is a flow chart depicting some examples of steps of a process in accordance with the present disclosure.

Referring to FIG. 1A, a process 10 in accordance with the present disclosure begins with an interleaved data acquisition at the gas and dissolved resonant frequencies for two echo times at process block 12. For example, a quadrature $^{129}$Xe vest coil tuned to, for example, 17.66 MHz at 1.5 T and proton-blocked to permit $^1$H MRI of the thoracic cavity with the scanner's body coil, may be used with a single-breath, 3-dimensional (3D) radial imaging of gas- and dissolved-phase 129Xe.

Figure 1B:
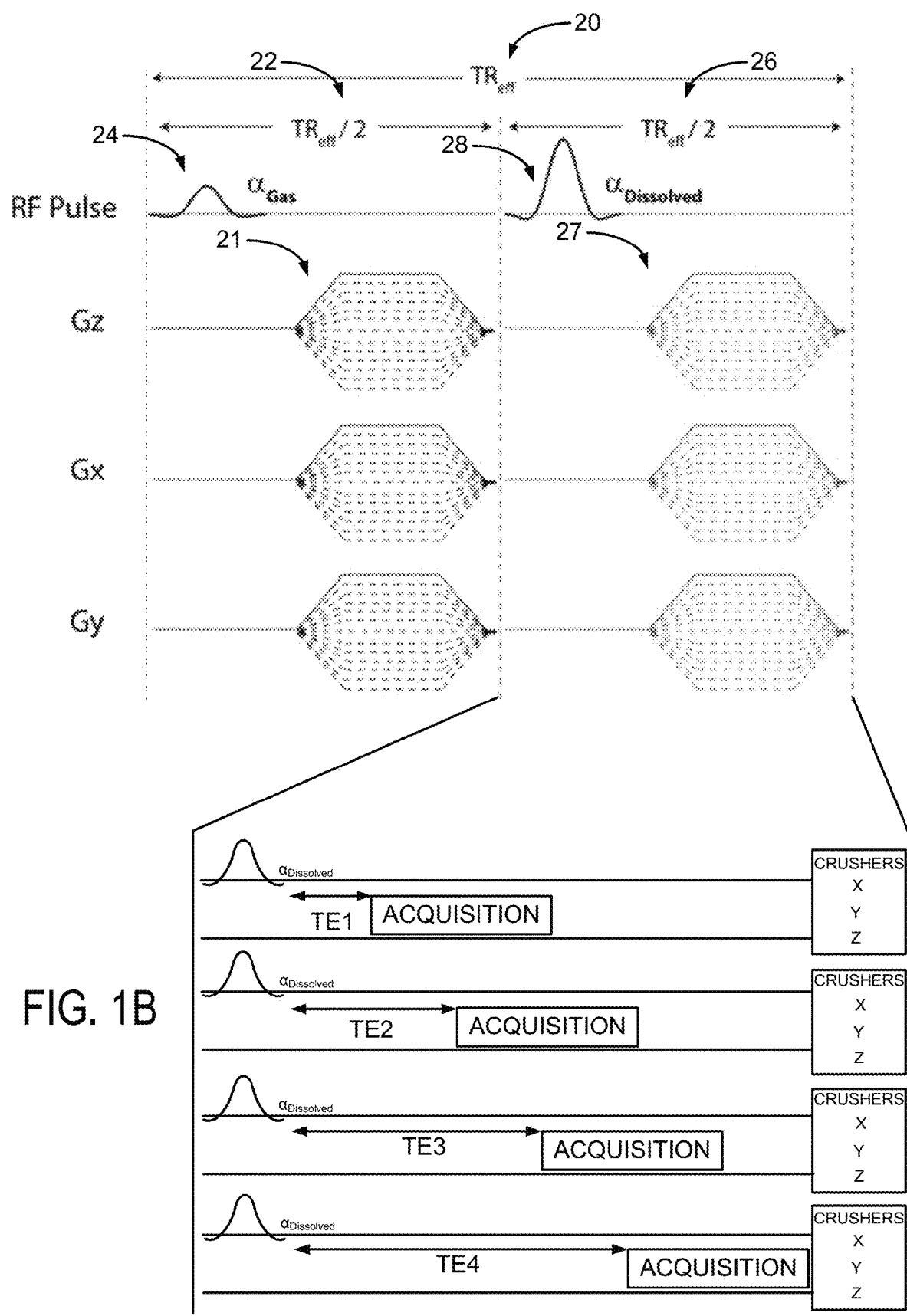
FIG. 1B is a pulse sequence diagram of a pulse sequence that may be used in accordance with the present disclosure.

As illustrated in FIG. 1B, over an effective repetition time ($TR_{eff}$) 20, a given radial trajectory through k-space is achieved using a series of gradients 21 is acquired over a first half of the $TR_{eff}$ 20 ($TR_{eff}/2$) 22 following excitation of the gas phase using a first RF pulse ($\alpha_{Gas}$) 24. Then, over a second half of the $TR_{eff}$ ($TR_{eff}/2$) 26, a second identical trajectory through k-space is acquired using a series of gradients 27 after excitation of the dissolved phase using a second RF pulse ($\alpha_{Dissolved}$) 28. The RF pulses may be a Shinnar Le Roux (SLR) RF pulse that can be carefully designed to have minimal stop band ripple (e.g., 0.1%) in order to generally control against off-resonance power across a range of transmit powers and off-resonant frequencies.

In one non-limiting example, each radial view of k-space is acquired with the transmit and receive frequencies set on the gas-phase resonance (0 Hz) and then on the dissolved-phase resonance (−3,832 Hz). The resulting 3D k-space trajectories for both resonances can be reconstructed separately to yield separate images.

Traditionally, interleaved acquisitions targeting the gas and dissolved phases have aligned the end of the RF pulses 24, 28, with flip angle ($\alpha$), relative to the beginning of the sampling window for acquisition of gas phase data. The present disclosure recognizes that the gas signal is substantially larger than the dissolved signal and that the off-resonance signal of the gas can be used to determine a scaling factor ($\sigma$) to advantageously select timing for the acquisitions, for example, by selecting echo times.

That is, the present disclosure provides a system and method for the simultaneous acquisition and correction of multi-TE gas and dissolved phase images because: (1) gas-phase contamination of the dissolved-phase may be estimated from gas-only data multiplied by a scale factor ($\sigma$) and modulated by the known off-resonance frequency, and (2) the gas-phase contamination of the dissolved-phase images can be isolated from dissolved-phase components by exploiting the short T2* of the latter and comparatively long T2* of gaseous Xenon.

Thus, two separate interleaved images are acquired via 3D radial sampling. At each echo time and view, sampling is performed at two different frequencies (on resonance and off resonance). As such, an on-resonance gas sampling period, an on-resonance dissolved sampling period, an off-resonance gas sampling period, and an off-resonance dissolved sampling period are presented, whereby the timing of acquisitions associated with a given period is selected to control the influence of gas contamination without requiring very careful calibration of the stop-band attenuation characteristics of the pulse, which can constrain other critical pulse design elements (e.g. flip angle). More particularly, in a given implementation one may perform an on-resonance gas sampling and an on-resonance dissolved phase sampling. The on-resonance dissolved phase sampling may be mixed with off-resonance gas-phase sampling (which is just the gas-phase contamination) and can be reconstructed from the on resonance gas and dissolved acquisitions.

The first TE may be set such that the RBC and TP components are 90° out of phase, to facilitate a 1-point Dixon separation. The second TE may be delayed and used for the estimation of the contaminant gas signal, as described further below. Alternatively, an IDEAL-based model may be utilized, which as will be described takes the form: IDEAL model+$\hat{s}_g(\vec{k}, t)$.

More particularly, as will be described, multiple echoes (e.g., four) can be acquired and gas-phase contaminant signal can be estimated using an IDEAL-based model that accounts for the dissolved-phase signal present. This technique results in dissolved-phase spectroscopic images with <1% contamination from gaseous HP 129Xe signal, improving performance by an order of magnitude compared to the method, also described below, that is performed using only two echoes.

As further illustrated in FIG. 1B, in a single breath, dissolved-phase spectra are acquired in an interleaved manner. Specifically, the dissolved-phase spectra acquired at 4, successively-longer, echo times are illustrated. In one non-limiting example, each TE2 may be twice the length of TE1, TE3 may be three times the length of TE1, and TE4 may be four times the length of TE1. However, the durations of each TE may be varied as described below to improve signal to noise ratio. Crusher gradients may be played out on all three gradient axes to de-phase any off-resonant gas-phase signal.

Returning to FIG. 1A, as indicated at process block 14, the measured dissolved phase signal at the first, and shortest, echo time ($s_{d,raw,1}(\vec{k})$) is modeled as a sum of the true dissolved phase signal and the contaminating, off resonant gas phase signal:

$$s_{d,raw,1}(\vec{k}) = s_d(\vec{k}) + \hat{s}_g(\vec{k}) \tag{1}$$

Note that this contaminant gas signal ($\hat{s}_g$), arises from the acquired gas phase HP 129Xe ($s_g$). The two are related by accounting for the difference in frequency between acquisitions ($\Delta f$) and the change in the magnitude and phase of the excitation such that:

$$\hat{s}_g(\vec{k}) = \sigma\, s_g(\vec{k}) e^{2\pi i \Delta f\, t(\vec{k})} \tag{2}$$

where $\sigma$ is a complex-valued constant accounting for the difference in RF pulse resonant frequencies and flip angles for the gas and dissolved phase HP 129Xe compartment excitations, and $t(\vec{k})$ is the readout time. Because the frequency shift and timing of the sequence are known and the gas resonance data is measured, estimation of the contaminant gas phase signal is reduced to the estimation of a single complex value, $\sigma$.

At process block 16, the gas contamination can be estimated. Because $\sigma$ depends only on the differences in gas phase excitation, it will be independent of echo time. Exploiting the short $T_2^*$ of the dissolved phase signals ($\approx 2$ ms at 1.5 T) relative to the gas phase ($\approx 25$ ms at 1.5 T), the second echo time is chosen such that the dissolved phase has decayed substantially, leaving a signal ($s_{d,raw,2}(\vec{k})$) that is dominated by the contaminant gas phase. Mathematically this approximation can be stated as:

$$s_{d,raw,2}(\vec{k}) = s_{d,2}(\vec{k}) + \sigma\, s_{g,2}(\vec{k}) e^{2\pi i \Delta f\, t(\vec{k})} \approx \sigma\, s_{g,2}(\vec{k}) e^{2\pi i \Delta f\, t(\vec{k})} \tag{3}$$

For example, the second echo time ($TE_2$) is acquired at a multiple of $TE_1$. Alternatively, $TE_2$ may be set as $TE_1$ plus an offset. In either case, $TE_2$ is set to be sufficiently long to allow the dissolved phase has decayed substantially, leaving a signal that is dominated by the contaminant gas phase. For example, $TE_2$ may be 4× $TE_1$, as described above and illustrated in FIG. 1B.

Using the measured second echo data at both the dissolved and gas resonant frequencies, $\sigma$ can be estimated as:

$$\sigma = \arg\min_{\sigma} \left\| s_{d,raw,2}(\vec{k}) - \sigma s_{g,2}(\vec{k}) e^{2\pi i \Delta f\, t(\vec{k})} \right\|_2 \tag{4}$$

Finally, at process block 18, the gas phase contamination can be removed from the first echo dissolved phase signal using:

$$s_{d,1}(\vec{k}) \approx s_{d,raw,1}(\vec{k}) - \sigma\, s_{g,1}(\vec{k}) e^{2\pi i \Delta f\, t(\vec{k})} \tag{5}$$

As described above, a process is provided that utilizes a 1-point Dixon based chemical species separation approach. As also described above, gas-contamination is also a concern for other approaches, including IDEAL-based approaches that do not take its presence into account. Doing so requires estimation of this additional parameter (i.e. gas-phase component amplitude), and thus acquisition of an additional echo to do so. Because (1) the gas-phase is so far off-resonance from the dissolved-phase components (3832 Hz at 1.5 T) and (2) non-Cartesian trajectories are being used, problems in principle may arise with using IDEAL to model all three components simultaneously. In IDEAL, a single value of the complex-valued field modulation (combined effects of $B_0$ and $T_2^*$) is assumed in each voxel. However, due to the effects of (1) and (2) above, a single image voxel will contain gas-phase signal aliased from a wide range of positions, and thus potentially a wide range of field modulations. In essence, if the spatial variations in the field modulation occur on the scale of the gas-phase point spread function, it cannot be modeled with IDEAL.

In particular, multi-echo data can be acquired at both the gas-phase and dissolved-phase resonant frequencies, as described above. The acquired dissolved-phase data, contaminated with gas-phase signal, can be modeled as follows:

$$s_{d,raw}(\vec{k}, t) = s_{d,true}(\vec{k}, t) + \sigma\, s_{gas}(\vec{k}, t) e^{2\pi i \Delta f\, t} \tag{6}$$

where, again, $s_{d,raw}$ and $s_{gas}$ are the acquired dissolved- and gas-phase data, respectively; $\sigma$ is a correction factor for the change in excitation of the gas between the dissolved- and gas-phase acquisitions; and $\Delta f$ is the change in the receive frequency between the dissolved- and gas-phase acquisitions. If $\sigma$ can be estimated, the contaminating gas signal can be subtracted from the dissolved-phase data.

The dissolved-phase signal $s_{d,true}$ can be expanded in terms of the RBC and barrier components.

$$s_{d,raw}(\vec{k}, t) = \rho_{rbc}(\vec{k}) e^{(2\pi i\, fbrc - r^*2rbc)t} + \rho_{bar}(\vec{k}) e^{(2\pi i\, fbar - r^*2bar)t} + \sigma\, s_{gas}(\vec{k}, t) e^{2\pi i \Delta f\, t} \tag{7}$$

where $\rho_{rbc}$ and $\rho_{bar}$ are the Fourier transforms of the RBC and barrier spin densities, respectively; and f and $r^*_2$ are the frequency shifts and transverse relaxation rates of the dissolved-phase components which may be estimated from global spectroscopy performed prior to imaging. From this model, one can iteratively solve for $\rho_{rbc}$, $\rho_{bar}$, and σ until σ converges. Contaminant gas-phase signal may then be subtracted from the dissolved-phase signal based on Eqn. 6.

EXAMPLES

Computer simulations were performed to characterize the performance of the above-described gas estimation method under known conditions and to quantify the effect of gas contamination and correction on the separated images of the RBC and TP components of the dissolved phase. Simulated results were then used for comparison to experiments in human subjects.

Human subjects (8 healthy volunteers, 3 female, 5 male, ages 30-69 with mean 54.9 and standard deviation 12.5; and 1 idiopathic pulmonary fibrosis patient, male, age 64) underwent HP 129Xe MRI on a 1.5 T scanner using a quadrature vest coil tuned to the xenon resonant frequency of 17.66 MHz at 1.5 T.

Computer Simulated Experiments

Two digital phantoms, one for lung air space and one for lung parenchyma, were created based on human subject imaging with HP 129Xe. The phantoms mimicked the shape of the lungs, with a uniform value throughout the lung volume and a resolution of 64×64×64 voxels, matching the imaging matrix used in human subject scans. The first phantom ($\rho_g$) was used for simulation of gas phase images and included the large airways; the second ($\rho_d$), used for simulation of dissolved phase images, included only the lung parenchyma.

From the digital phantoms, gas and dissolved phase signal was generated based on the signal model described by Eqns. 8a and 8b, where the chemical shift frequencies (f), transverse relaxation ($T_2^*$), and relative magnitudes of the TP and RBC components (a) are included. Complex, Gaussian random noise was added to evaluate the dependence of the method on the SNR of the on resonance gas and dissolved phase images ($SNR_g$ and $SNR_d$, respectively).

$$s_g(\vec{k}, t) = \mathcal{F}_{\vec{k}}\left[\rho_g e^{-\frac{t}{T_{2g}^*}}\right] + \mathcal{CN}\left(0, \frac{1}{SNR_g}\right). \quad (8a)$$

$$s_{d,raw}(\vec{k}, t) = \mathcal{F}_{\vec{k}}\left[a_{TP}\rho_d e^{2\pi i f_{TP} t} e^{-\frac{t}{T_{2TP}^*}} + a_{RBC}\rho_d e^{2\pi i f_{RBC} t} e^{-\frac{t}{T_{2RBC}^*}} + \sigma\rho_g e^{2\pi i f_g t} e^{-\frac{t}{T_{2g}^*}}\right] + \mathcal{CN}\left(0, \frac{1}{SNR_d}\right). \quad (8b)$$

In this model, $\mathcal{F}_{\vec{k}}$ represents the discrete Fourier transform evaluated at the specified k-space vector. The relative magnitudes of the TP and RBC components were chosen such that they summed to 1. Simulated signals were generated along the same 3-dimensional radial trajectory used in the human subject studies. Values for the timing of each acquisition were based upon specified echo times and a 31.25 kHz receive bandwidth. Simulated values for the transverse relaxation and frequency shifts of each species during the dissolved phase readout were based upon in vivo spectroscopy at 1.5 T and are specified in Table 1.

TABLE 1

Properties of gas and dissolved phase HP 129Xe at 1.5 T.

| Species | T2* (ms) | F (Hz) |
|---|---|---|
| Gas | 25 | 3832 |
| TP | 2.4 | 347 |
| RBC | 2.1 | 0 |

100 trial datasets were generated for each value of the four variables investigated with independent noise. For each dataset, the amount of gas-phase contamination was estimated and compared to the value used to generate the simulated data. The mean and standard deviation of the error over the 100 trials was recorded. The simulated RBC/Barrier ratio was set to 40% for all datasets, and the first TE was set to 0.9 ms. The remaining simulation values are specified below for each of the four in silico experiment performed. Note that some variables, while not under investigation, were selected randomly from within a range of expected values.

Delay between echoes: The delay between echoes was varied from 1 to 6 ms. Dissolved-phase image SNR was set to 8, while the gas-phase SNR was 16. The level and phase of the gas contamination was randomly selected for each dataset between 0 to 100% of the dissolved-phase signal and 0 to 360°, respectively.

Image SNR: Dissolved-phase image SNR was varied from 1 to 20. The delay in echoes was set to 3.3 ms, yielding a TE2 of 4.2 ms. The magnitude and phase of the contaminant gas-phase signal were randomized as above.

Magnitude of contaminant signal: The magnitude of the contaminant signal was varied from 0% to 100% of the dissolved-phase signal magnitude. TE2 was set to 4.2 ms. The dissolved-phase image SNR was held at 8, while gas-phase SNR was 16. The phase of the contaminant signal was randomly selected for each dataset.

Phase of contaminant signal: The phase of the contaminant signal was varied from 0 to 360°. TE2 was set to 4.2 ms. The dissolved-phase image SNR was held at 8, while gas-phase SNR was 16. The magnitude of the contaminant signal was randomly selected for each dataset between 0 and 100% of the dissolved-phase signal.

Simulated data were also used to analyze the impact of gas contamination and the proposed correction method on estimation of the RBC and TP components. For these tests simulated data were generated with 100 independent trials, each with unique noise and phase realizations, for the cases of no contamination and 50% gas contamination. A total of 100 trials was found to be sufficient to show the range of variation possible. As the effects of gas contamination on the images are strongly dependent on the initial phase, the starting phase of the gas contamination was randomized for each trial to show the range of effects contamination can have on dissolved phase images as well as their consequences for quantitative measures of TP and RBC components. The remaining simulation parameters were held constant at values representative of those observed in human subject scans: dissolved-phase SNR was set to 8, gas-phase SNR to 16, and RBC/Barrier ratio to 40%.

For each trial, the data were reconstructed both with and without applying our correction technique. The RBC and TP phases were then separated using the 1-point Dixon technique. The mean and standard deviation of each component was recorded over the lung volume, and compared the results of the raw, uncorrected data to the corrected data.

Human Subject Experiments

The 129Xe gas (87% isotopically enriched) was hyperpolarized via spin-exchange optical pumping using a commercially available polarizer. A total of 1 liter of HP 129Xe gas was cryogenically accumulated and subsequently thawed into an ALTEF bag fitted with a quick-disconnect attachment. Polarization of the collected gas was measured at ~14-18% at a polarization measurement station.

Subjects were administered the HP 129Xe gas using a non-rebreather mask with a quick-disconnect attachment fitted to the input port. Subjects were coached to exhale to FRC, during which the bag of HP 129Xe was connected to the mask input port. The entire 1-liter bag was then inhaled followed by a breath hold of approximately 15 seconds.

Imaging data was acquired for use with a 1-point Dixon technique, as previously described by above. Briefly, data was acquired using a 3D radial pulse sequence of FIG. 1B during a 15-second breath hold following inhalation of 1-L of HP-129Xe. Each radial projection of k-space was acquired twice, with the transmit/receive frequencies set to the gas phase and RBC resonances, respectively (3832 Hz difference). Additional acquisition parameters were: FOV=40 cm, matrix=64×64×64, TR=7.5 ms, BW=31.25 kHz, flip-angles (dissolved/gas)=0.5°/22°. The echo time ($TE_1$) was adjusted based on a separate calibration scan such that the tissue and RBC components are 90° out of phase. Calibration scanning involved the acquisition of 200 whole lung spectra on the RBC resonance (512 points, 32 µs sample rate, 18°-24° flip angle, TR=20 ms, TE=0.7 ms), and the first 50 were discarded to allow the saturation of RBC magnetization downstream of the capillary beds. The latter 150 spectra were averaged and fit to 3 Lorentzians, one each for the RBC, barrier and gas components. The relative areas and frequencies of these fitted peaks were used to estimate the RBC-to-barrier ratio and the precise $TE_1$ for Dixon imaging. The value of $TE_1$ was typically found to be around 0.9 ms (with a range of 0.8-1 ms) in this work.

Data acquisition differs substantially from traditional techniques, such as described by Kaushik et al. in Single-Breath Clinical Imaging of Hyperpolarized $^{129}$Xe in the Airspaces, Barrier and Red Blood Cells using an Interleaved 3D Radial 1-point Dixon Acquisition. *Magn Reson Med.* 2016; 75(4):1434-1443, which is incorporated herein by reference. Specifically, as illustrated in FIG. 1B, first, as compared to Kaushik et al., a second echo time was acquired at a multiple of $TE_1$ to estimate the gas phase signal based on the assumption in Eqn. 3. As one non-limiting example, $TE_2=TE_1+3.3$ ms ($TE_2 \approx 4\ TE_1$). The second echo time was chosen to be appreciably long. In a non-limiting example, the second echo time may be extended as long possible to estimate gas phase signal without requiring an increase in the imaging TR. Second, a Shinnar Le Roux (SLR) RF pulse (1.2 ms, 5 kHz bandwidth) can be carefully designed to have minimal stop band ripple (0.1%) in order to generally control against off-resonance power across a range of transmit powers and off-resonant frequencies. The transmit power can be adjusted for each scan based on a flip angle estimate from the calibration spectra to provide the exact flip angles desired, correcting for any variations in loading of the RF coil.

Processing and Analysis for Gas Correction

Images were reconstructed identically for both simulated and human subject data. In both cases, k-space data was interpolated onto a regular Cartesian grid using iteratively estimated sampling density compensation weights to account for the non-uniformly sampled k-space coordinates. Images were then generated by inverse Fourier transform of the resampled k-space data.

Raw gas phase and dissolved phase k-space data were separated and used to compute the gas contamination scale factor and correct the dissolved phase signal as described herein.

The degree of gas phase contamination was evaluated qualitatively by reconstructing dissolved phase image data from the longer, second echo time, following demodulation of the data at the gas phase signal resonance. In these comparisons, the demodulated dissolved phase k-space signal, $s_{d,dem}$, was $$s_{d,dem}(\vec{k}, t) = s_d(\vec{k}, t)e^{-2\pi i \Delta f t} \qquad (9);$$

where $s_d$ is the original dissolved phase k-space data, t is the time at which k-space coordinate $\vec{k}$ is acquired, and $\Delta f$ is the gas-phase resonant frequency relative to the RBC component (3832 Hz). Note that the dissolved phase signal has largely decayed by the second echo time. These images of the gas phase contaminant were compared to the actual gas phase (i.e. ventilation) image data acquired to determine the magnitude of gas phase signal contaminating the dissolved phase data. A similar reconstruction was then performed following correction to demonstrate the remaining gas contamination if any (See FIGS. 2E and 2F).

Processing and Analysis for RBC and TP Parametric Maps

In contrast to the simulated data where the RBC-to-tissue ratio was known a priori, the dissolved phase images for human subjects were separated into RBC and TP components using a whole lung RBC-to-tissue ratio measured from a separate calibration scan. Complex-valued dissolved phase images were rotated by an increasing phase until the whole lung ratio of the real-to-imaginary image components matched the known whole lung RBC-to-tissue ratio. Following this rotation, the RBC and TP compartments were extracted from the real and imaginary components, respectively.

Raw RBC and TP component images were converted to absolute RBC-to-gas and TP-to-gas ratio images. Specifically, RBC and TP images were divided by the simultaneously acquired gas image and then scaled to account for the differences in flip angles (dissolved/gas=0.5°/22°) and $T_2$* decay. Parametric maps of RBC-to-gas and TP-to-gas ratios were also created. Reference normal RBC-to-gas and TP-to-gas ratio distributions were generated and used to classify the human subject maps by color based on the number of standard deviations from the reference normal mean. These parametric maps were compared in a subset of healthy subjects with and without using the proposed correction to show the presence of likely artifacts due to gas contamination and the ability of the correction to provide normal results. Parametric maps for a patient with IPF were included to verify that defects related to disease were retained after correction. Voxel-wise RBC-to-gas and TP-to-gas ratios throughout the entire lung were converted to histograms, which were also compared before and after gas contamination correction. Qualitative comparisons to simulation results were made to establish whether simulated and human data trends were in agreement.

Statistical Analysis

Quantitative comparisons were made in the healthy normal cohort by comparing: 1) dispersions (variances) of the whole lung means using the Ansari Bradley test (as described in Ansari A R, Bradley R A. Rank-sum tests for dispersions. *Ann Math Statist.* 1960; 31(4):1174-1189 and incorporated herein by reference) and 2) means of the whole lung variances before and after the proposed correction using a paired t-test. Differences were considered statistically significant when P<0.05.

Results

Typical coronal dissolved-phase images covering the lung volume for both simulation and healthy human subject experiments are compared for identical acquisition parameters are provided in FIGS. 2A-2F. Notably, artifacts are found in the uncorrected images for both simulation, as shown in FIGS. 2A and 2B, and human subject, as shown in FIGS. 2C-2F, experiments. Due to the large off-resonance of the gas phase signal (3.8 kHz at 1.5 T) acquired with the 3D radial trajectory, the contaminant signal experiences severe blurring and complex phase behavior creating artifacts interior to and around the lung periphery. Unfortunately, these artifacts manifest as additional, false, heterogeneity within the lungs, as highlighted by the arrows in FIGS. 2A-2D. The reconstruction of the dissolved phase image at the gas resonance at $TE_2$ depicts the magnitude of the underlying gas signal as an image, as illustrated in FIG. 2E, that is largely removed after correction, as illustrated in FIG. 2F.

Estimation of Gas Contamination

Figure 3A:
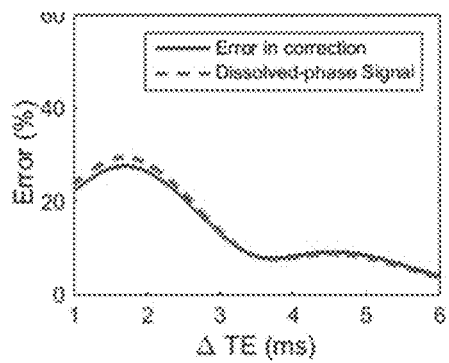
FIG. 3A is a graph created from quantitative simulation results depicting the expected theoretical performance of the proposed correction, where the residual gas contamination error (as a % of dissolved-phase signal at $TE_1$), is approximately proportional to dissolved-phase signal remaining at $TE_2$; however, the error is influenced by the relative phase between the RBC and tissue components of the dissolved-phase signal, evidenced by the local minimum in the residual contamination error near 3.7 ms.
Figure 3B:
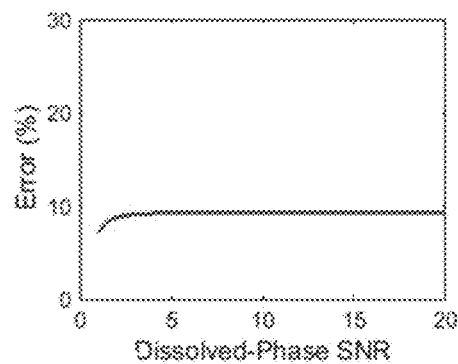
FIG. 3B is a graph created from quantitative simulation results depicting the expected theoretical performance of the proposed correction, showing that the image SNR also has no effect on the residual contamination error.
Figure 3C:
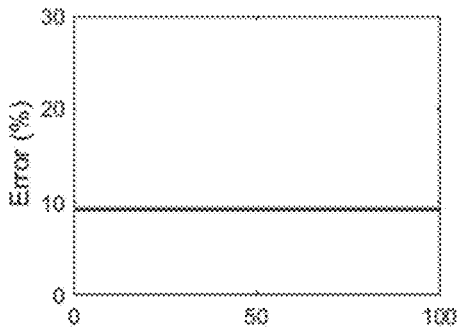
FIG. 3C is a graph from quantitative simulation results depicting the expected theoretical performance, with the echo times used, of the proposed correction, showing the confidence intervals of the measures are smaller than the width of the line for SNR>2 and the residual error appears independent of magnitude.
Figure 3D:
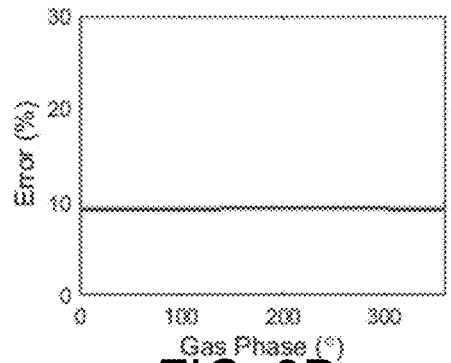
FIG. 3D is a graph from quantitative simulation results depicting the expected theoretical performance of the proposed correction, with the echo times used, showing residual error appears independent of phase of the gas contamination itself.

Quantitative comparisons in the simulation experiments show the method is highly dependent on the delay between echoes, as illustrated in FIG. 3A. As this delay increases, the correction technique performs increasingly well due to the decay of the dissolved relative to the gas phase signals. As described above, this technique is predicated on the assumption that the dissolved phase signal is negligible in the second echo. The error in the estimate of gas contamination therefore increases with the amount of dissolved phase signal residual in the second echo. Based on the delay used in the human subject scans (3.3 ms), simulated data predicts a residual error of 9% relative to the first echo dissolved phase magnitude. Importantly, simulation results also indicate that the proposed method is robust to both dissolved phase SNR and the magnitude and phase of the gas contamination, as illustrated in FIGS. 3B-3D. Notably, implementing the above-described techniques for acquisition of multiple echoes with an IDEAL-based method, a robust gas removal method is presented that reduces signal from gas-phase excitation to below 1% of dissolved-phase signal.

Estimation of RBC and TP Components

Figure 4A:
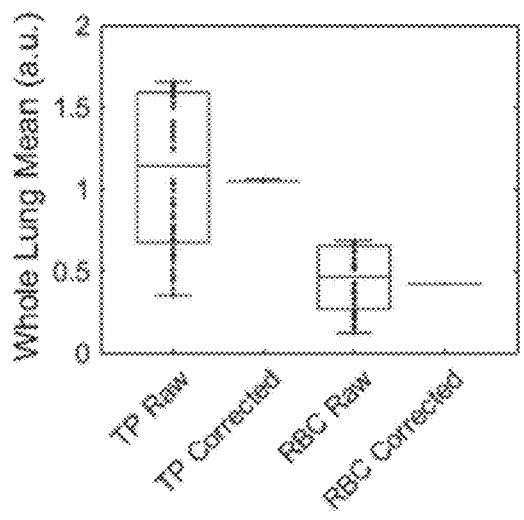
FIG. 4A is a graph showing a distribution of the whole lung mean of TP and RBC values in the simulated data before and after correction for gas contamination.
Figure 4B:
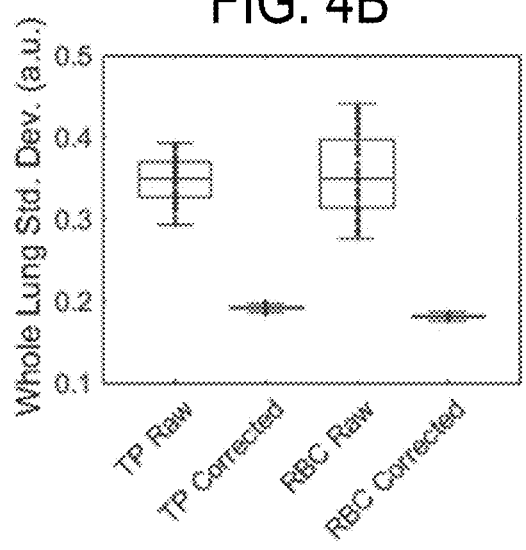
FIG. 4B is a graph showing a distribution of the standard deviations of TP and RBC values in the simulated data before and after correction for gas contamination.
Figure 4C:
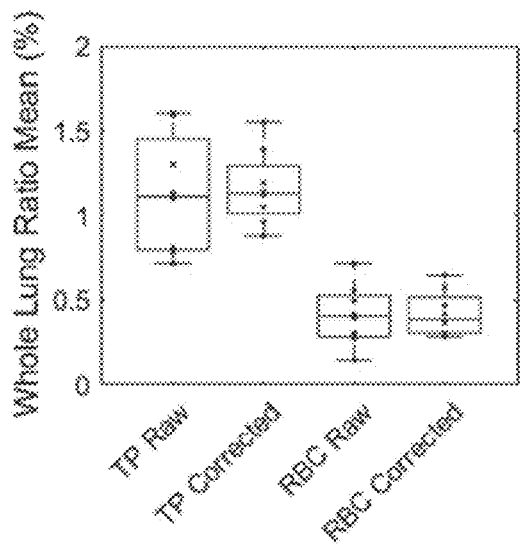
FIG. 4C is a graph showing a distribution of the whole lung mean of TP and RBC values in a healthy human subject cohort before and after correction.
Figure 4D:
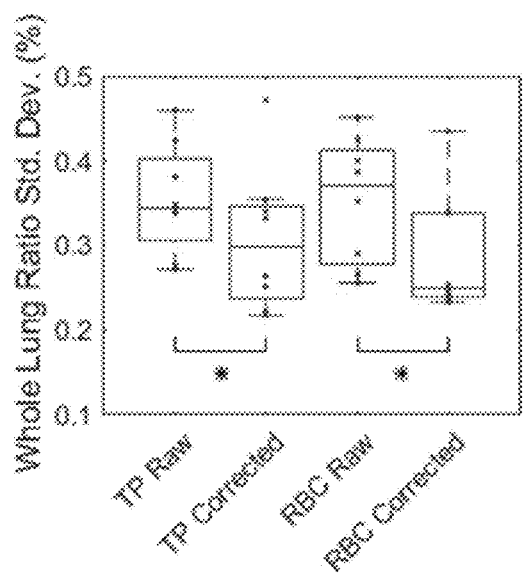
FIG. 4D is a graph showing a distribution of the standard deviations of TP and RBC values in a healthy human subject cohort before and after correction.

Both RBC-to-gas and tissue-to-gas ratios followed a similar pattern for human subject and simulation experiments as shown in FIGS. 4A-4D. For the simulation experiments, whole lung ratio measures are more tightly grouped following correction, indicated by a smaller standard deviation of the mean values at the cost of a small bias of ~5%, as illustrated in FIG. 4A. Comparable measures in human subjects are provide in FIG. 4C, which indicate similar behavior, although the differences before and after correction did not reach statistical significance (TP-to-gas: 0.351 raw, 0.2218 corrected, P=0.057; RBC-to-gas: 0.180 raw, 0.134, P=0.303). The spatial heterogeneity introduced by the gas phase contamination, as described above with respect to FIGS. 2A-2J, is quantitatively estimated by the standard deviation of the respective ratios over the lung volume. For the simulation, the standard deviation of both the TP-to-gas and RBC-to-gas across the lung volume are reduced to ~10% higher standard deviation than the background noise level, as illustrated in FIG. 4B. For the human subjects the reduction in standard deviation is less pronounced, as illustrated in FIG. 4D, but reaches statistical significance (TP-to-gas: 0.355 raw, 0.306 corrected, P=0.010; RBC-to-gas: 0.353 raw, 0.291 corrected, P=0.045). Thus, the large dispersion in the global mean values caused by the contaminant gas signal is removed in the simulation experiments, and for the TP/Gas ratio in the human subject experiments. The regional standard deviation after correction reflects reduced regional heterogeneity in both simulation and human subject results (* indicate P<0.05). Asterisks indicate the mean value observed in simulated data with no contamination. The numerical measures of RBC and TP values for all experiments are further summarized in Table 2.

TABLE 2

Results summarizing impact of gas contaminant removal on quantitative measures of the dissolved phases.

| Simulation Data | | |
|---|---|---|
| | Raw | Corrected |
| Mean TP | 1.099 ± 0.453 | 1.048 ± 0.002 |
| Mean RBC | 0.447 ± 0.195 | 0.421 ± 0.001 |
| St Dev. of TP | 0.348 ± 0.028 | 0.192 ± 0.003 |
| St Dev. of RBC | 0.355 ± 0.049 | 0.182 ± 0.002 |
| Human Subject Imaging | | |
| | Raw (%) | Corrected (%) |
| Mean TP/Gas | 1.13 ± 0.35 | 1.16 ± 0.22 |
| Mean RBC/Gas | 0.41 ± 0.18 | 0.42 ± 0.13 |
| St Dev. of TP/Gas | 0.35 ± 0.07 | 0.31 ± 0.08 |
| St Dev. of RBC/Gas | 0.35 ± 0.07 | 0.29 ± 0.07 |

Human Subject Parametric Maps

Figure 5A:
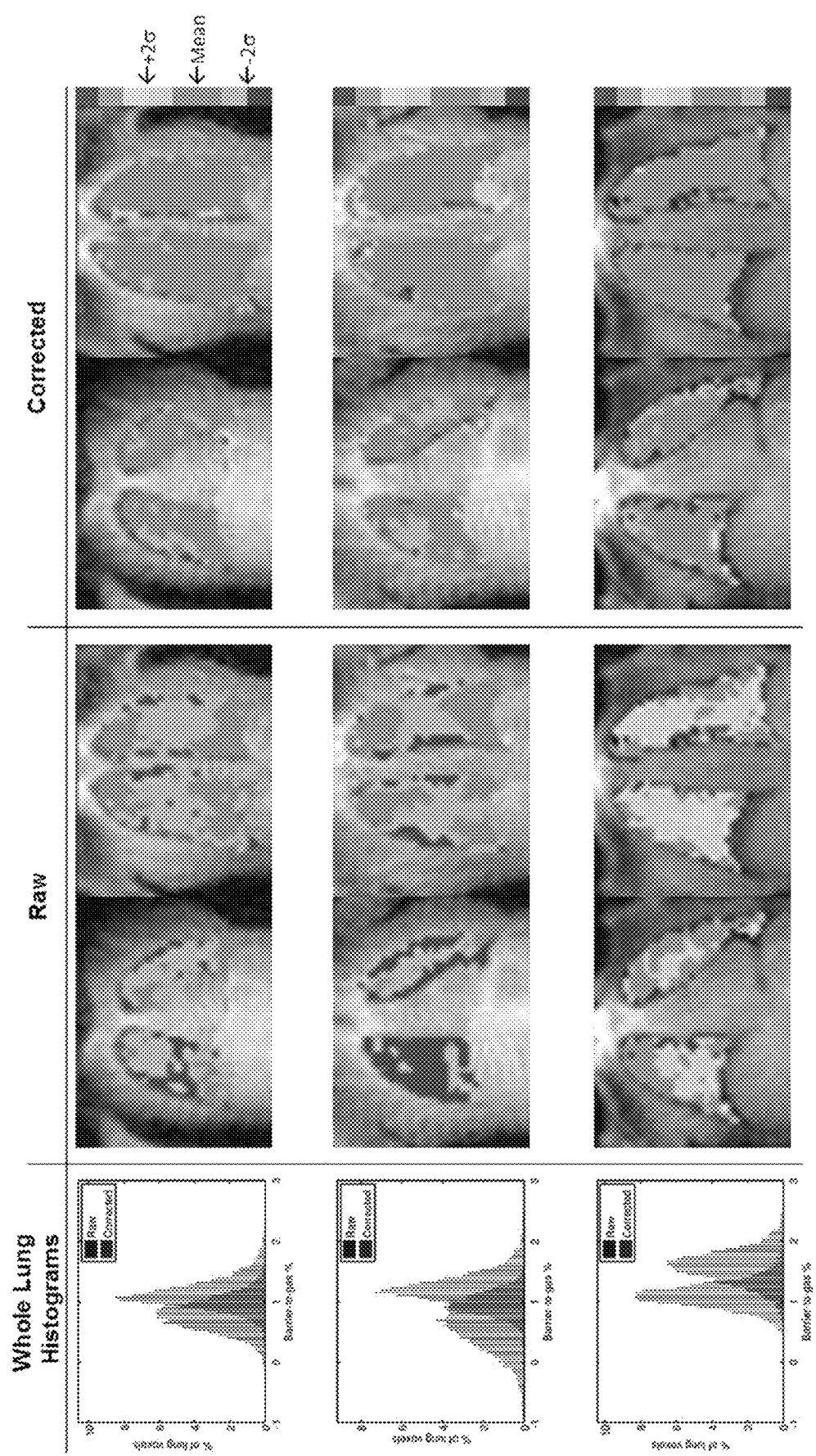
FIG. 5A is a set of images and graphs providing whole lung histograms and parametric maps of TP-to-gas ratio from 3 healthy normal human subjects (1 per row), where the histograms show whole lung parameter distributions that are narrower and more similar across subjects following the gas contamination correction and uncorrected parametric maps show numerous regions of defect and hyper-intensity that largely resolve post-correction.
Figure 5B:
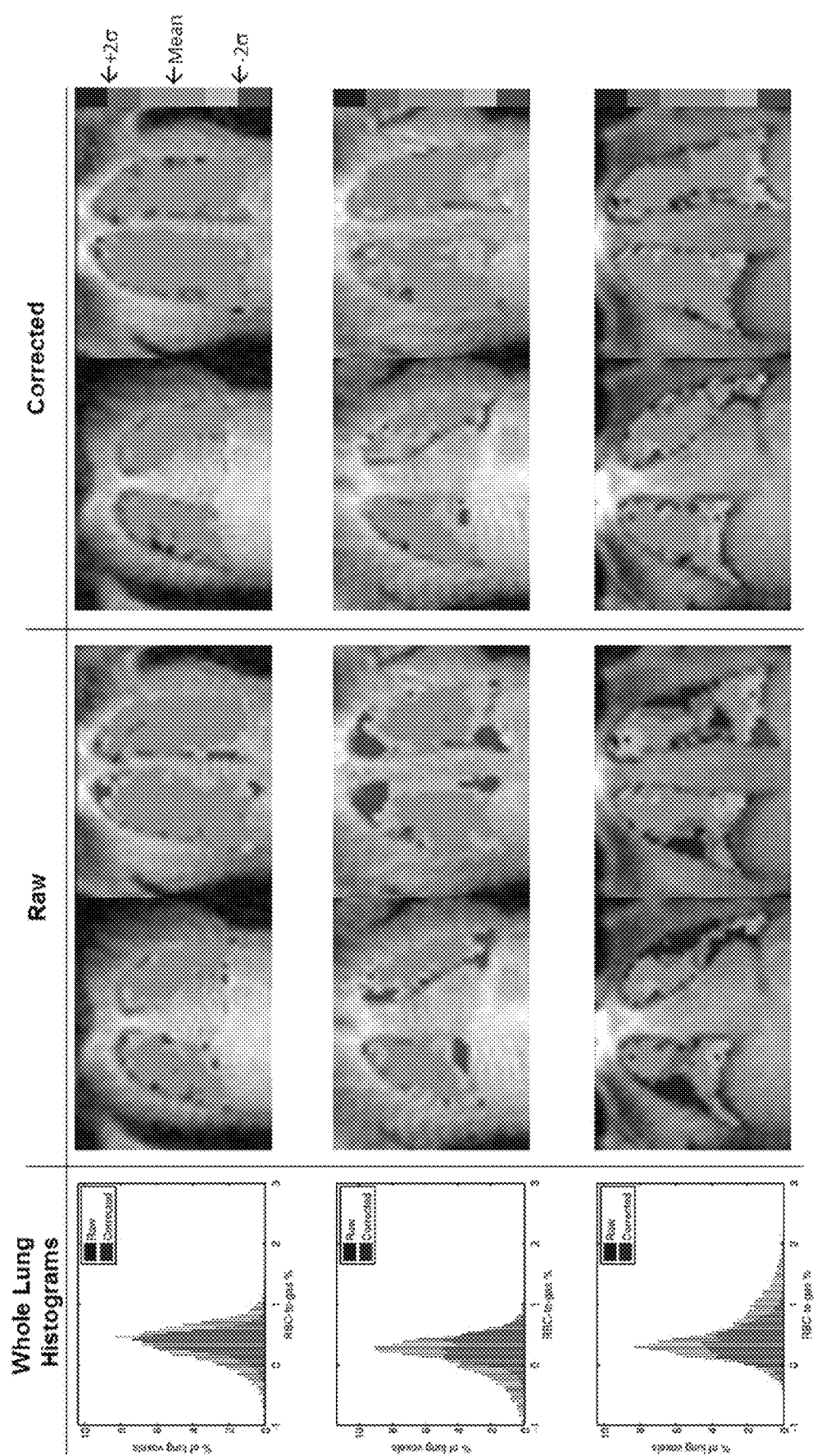
FIG. 5B is a set of images and graphs providing whole lung histograms and parametric maps of RBC-to-gas ratio from 3 healthy normal human subjects (1 per row), where the histograms show whole lung parameter distributions that are narrower and more similar across subjects following the gas contamination correction and uncorrected parametric maps show numerous regions of defect and hyper-intensity that largely resolve post-correction.
Figure 6A:
FIG. 6A is a whole lung histogram of TP-to-gas ratio from a subject diagnosed with idiopathic pulmonary fibrosis
Figure 6B:
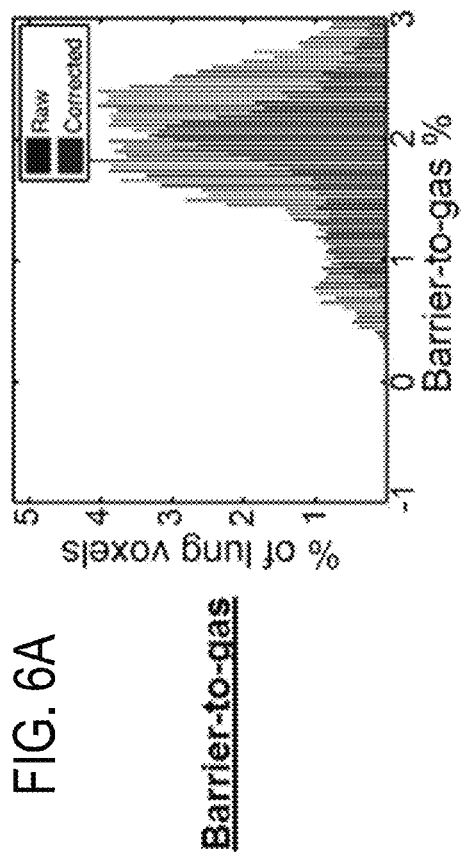
FIG. 6B is a whole lung histogram of RBC-to-gas ratio from a subject diagnosed with idiopathic pulmonary fibrosis
Figure 6D:
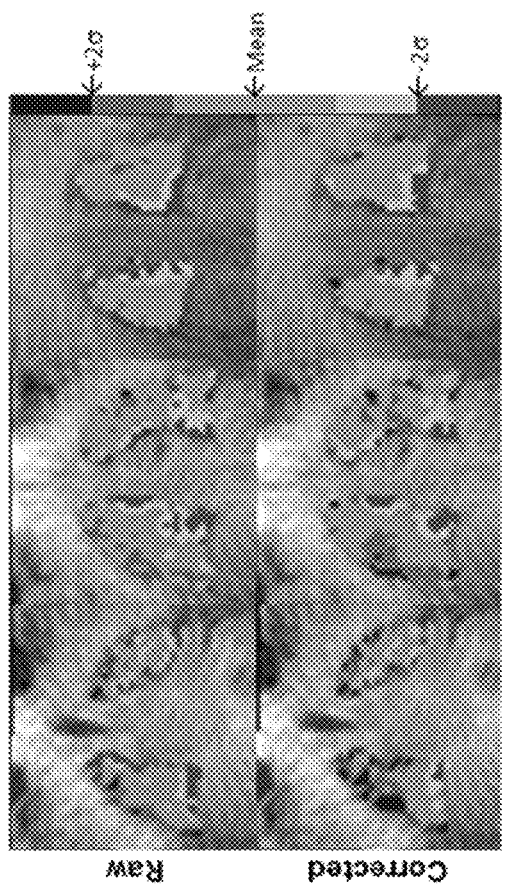
FIG. 6D is a set of parametric maps of RBC-to-gas ratio from a subject diagnosed with idiopathic pulmonary fibrosis.
Figure 6C:
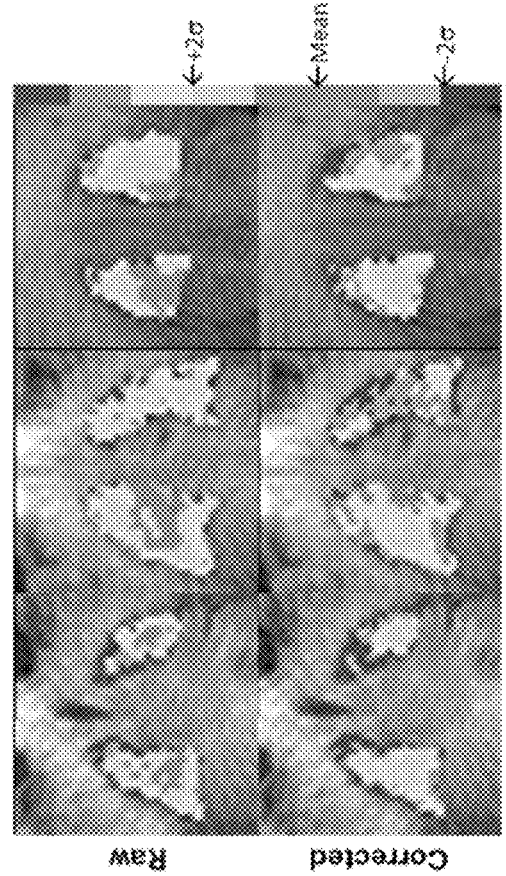
FIG. 6C is a set of parametric maps of TP-to-gas ratio from a subject diagnosed with idiopathic pulmonary fibrosis

Whole lung histograms and parametric maps from RBC-to-gas and TP-to-gas ratio estimates in 3 example healthy subjects are shown before and after the proposed correction, as illustrated in FIGS. 5A and 5B. After correction, the distributions of the ratios are narrower and more similar with respect to mean and overall shape. The histogram results are mirrored in the parametric maps indicating before correction numerous regions of both abnormally low and abnormally high TP-to-gas (FIG. 5A) and RBC-to-gas that resolve after correction (FIG. 5B).

A similar presentation is provided in the IPF patient, as shown in FIGS. 6A-6D. Importantly, the histograms are clearly different from the healthy subjects, showing areas of abnormally high TP-to-gas (pink color) and low RBC-gas (red color) ratios that are maintained following correction. While the underlying disease makes it more difficult to characterize the impact of the gas contamination, correction generally elevates regional TP-to-gas and RBC-to-gas ratios while preserving their histogram distributions.

Thus, the above-described numerical simulation and human subject results for dissolved-phase HP 129Xe MRI data demonstrate the problem of contamination by undesirable excitation of the more abundant gas-phase component even when using a carefully designed RF pulse with a narrow passband and minimal side lobes in the stopband. The impact of gas-phase contamination error includes increased variability in estimated TP- and RBC-to-gas ratios both across subjects and over the regions of the lungs.

Figure 7:
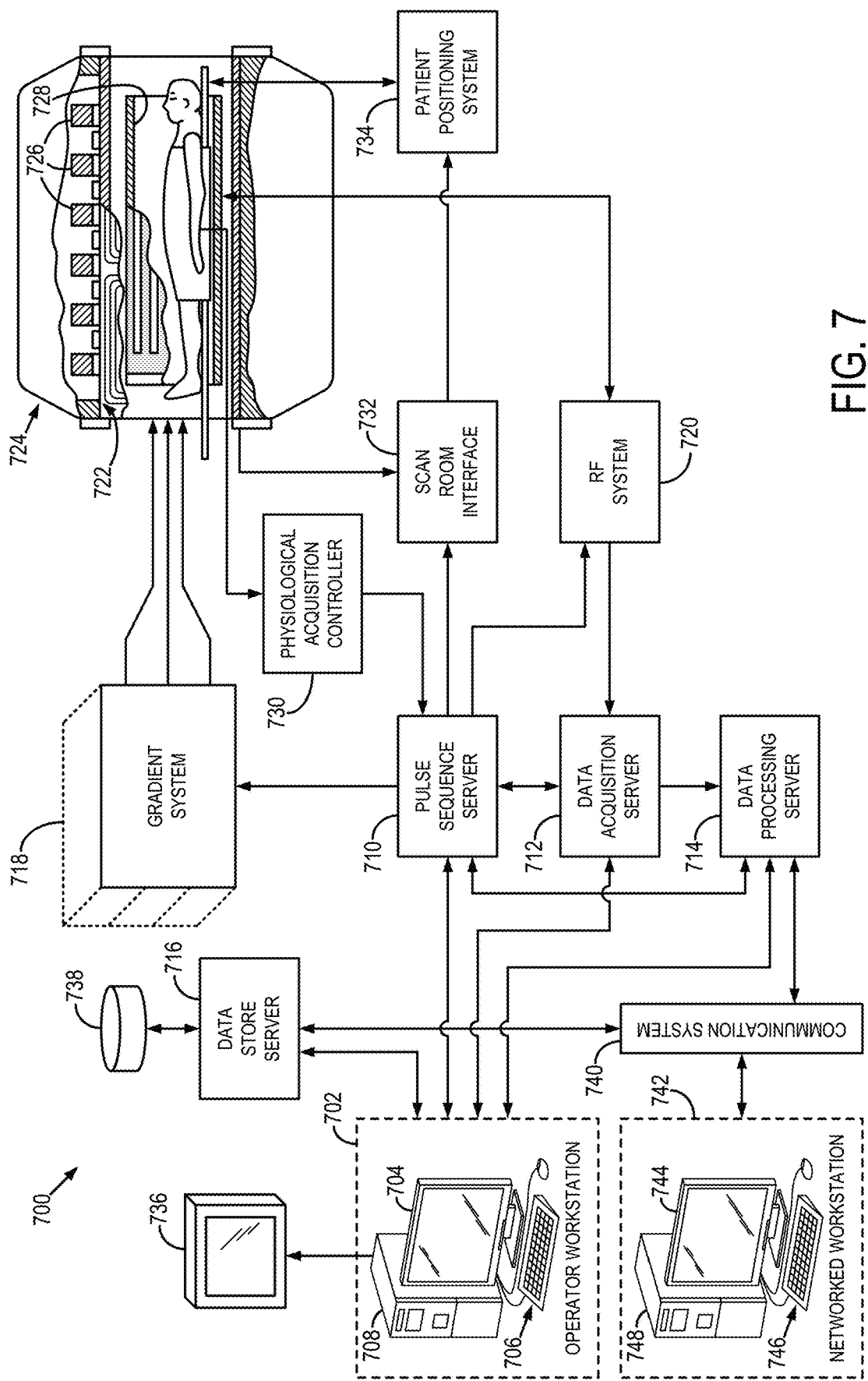
FIG. 7 is a block diagram of an example of a magnetic resonance imaging (MRI) system configured to employ the present disclosure.

The above-described processes may be performed using an MRI system 700, such is illustrated in FIG. 7. The MRI system 700 includes a workstation 702 having a display 704 and a keyboard 706. The workstation 702 includes a processor 708 that is commercially available to run a commercially-available operating system. The workstation 702 provides the operator interface that enables scan prescriptions to be entered into the MRI system 700. The workstation 702 is coupled to four servers: a pulse sequence server 710; a data acquisition server 712; a data processing server 714; and a data store server 716. The workstation 702 and each server 710, 712, 714, and 716 are connected to communicate with each other.

The pulse sequence server 710 functions in response to instructions downloaded from the workstation 702 to operate a gradient system 718 and a broad band radiofrequency (RF) system 720. Gradient waveforms necessary to perform the prescribed scan are produced and applied to the gradient system 718, which excites gradient coils in an assembly 722 to produce the magnetic field gradients $G_x$, $G_y$, and $G_z$ used for position encoding MR signals. The gradient coil assembly 722 forms part of a magnet assembly 724 that includes a polarizing magnet 726 and a whole-body RF coil 728 (or a head (and neck) RF coil for brain imaging, or a chest coil tuned to 129Xe nucleus for lung imaging).

RF excitation waveforms are applied to the RF coil 728, or a separate local coil, such as a chest coil, by the RF system 720 to perform the prescribed magnetic resonance pulse sequence. Responsive MR signals detected by the RF coil 728, or a separate local coil, are received by the RF system 720, amplified, demodulated, filtered, and digitized under direction of commands produced by the pulse sequence server 710. The RF system 720 includes an RF transmitter for producing a wide variety of RF pulses used in MR pulse sequences. The RF transmitter is responsive to the scan prescription and direction from the pulse sequence server 710 to produce RF pulses of the desired frequency, phase, and pulse amplitude waveform. The generated RF pulses may be applied to the whole body RF coil 728 or to one or more local coils or coil arrays.

The RF system 720 also includes one or more RF receiver channels. Each RF receiver channel includes an RF preamplifier that amplifies the MR signal received by the coil 728 to which it is connected, and a detector that detects and digitizes the quadrature components of the received MR signal. The magnitude of the received MR signal may thus be determined at any sampled point by the square root of the sum of the squares of the I and Q components:

$$M=\sqrt{I^2+Q^2} \tag{8}$$

and the phase of the received MR signal may also be determined:

$$\varphi = \tan^{-1}\left(\frac{Q}{I}\right). \tag{9}$$

The pulse sequence server 710 also optionally receives patient data from a physiological acquisition controller 730. The controller 730 receives signals from a number of different sensors connected to the patient, such as electrocardiograph (ECG) signals from electrodes, or respiratory signals from a bellows or other respiratory monitoring device. Such signals are typically used by the pulse sequence server 710 to synchronize, or "gate," the performance of the scan with the subject's heart beat or respiration.

The pulse sequence server 710 also connects to a scan room interface circuit 732 that receives signals from various sensors associated with the condition of the patient and the magnet system. It is also through the scan room interface circuit 732 that a patient positioning system 734 receives commands to move the patient to desired positions during the scan.

The digitized MR signal samples produced by the RF system 720 are received by the data acquisition server 712. The data acquisition server 712 operates in response to instructions downloaded from the workstation 702 to receive the real-time MR data and provide buffer storage, such that no data is lost by data overrun. In some scans, the data acquisition server 712 does little more than pass the acquired MR data to the data processor server 714. However, in scans that require information derived from acquired MR data to control the further performance of the scan, the data acquisition server 712 is programmed to produce such information and convey it to the pulse sequence server 710 or identify spectral components of the signal and the desired chemical shift frequencies for constrained reconstruction and appropriate selection of acquisition timings. For example, during prescans, MR data is acquired and used to calibrate the pulse sequence performed by the pulse sequence server 710. Also, navigator signals may be acquired during a scan and used to adjust the operating parameters of the RF system 720 or the gradient system 718, or to control the view order in which k-space is sampled. In all these examples, the data acquisition server 712 acquires MR data and processes it in real-time to produce information that is used to control the scan.

The data processing server 714 receives MR data from the data acquisition server 712 and processes it in accordance with instructions downloaded from the workstation 702. Such processing may include, for example: Fourier transformation of raw k-space MR data to produce two or three-dimensional images; the application of filters to a reconstructed image; the performance of a backprojection image reconstruction of acquired MR data; the generation of functional MR images; and the calculation of motion or flow images or multi-spectral image reconstruction based on known chemical shift frequencies.

Images reconstructed by the data processing server 714 are conveyed back to the workstation 702 where they are stored. Real-time images are stored in a data base memory cache (not shown), from which they may be output to operator display 704 or a display 736 that is located near the magnet assembly 724 for use by attending physicians. Batch mode images or selected real time images are stored in a host database on disc storage 738. When such images have been reconstructed and transferred to storage, the data processing server 714 notifies the data store server 716 on the workstation 702. The workstation 702 may be used by an operator to archive the images, produce films, or send the images via a network or communication system 740 to other facilities that may include other networked workstations 742.

The communication system 740 and networked workstation 742 may represent any of the variety of local and remote computer systems that may be included within a given clinical or research facility including the system 700 or other, remote location that can communicate with the system 700. In this regard, the networked workstation 742 may be functionally and capably similar or equivalent to the operator workstation 702, despite being located remotely and communicating over the communication system 740. As such, the networked workstation 742 may have a display 744 and a keyboard 746. The networked workstation 742 includes a processor 748 that is commercially available to run a commercially-available operating system. The networked workstation 742 may be able to provide the operator interface that enables scan prescriptions to be entered into the MRI system 700.

Thus, a system and method is provided to recover image quality and improve consistency and accuracy of quantitative TP- and RBC-gas ratios in realistic simulations. The simulations indicate that the performance of the correction is independent of both the initial degree of contamination and image SNR. The method can be used to reduce dissolved phase signal heterogeneity in healthy human lungs using a 1-point Dixon acquisition sequence with parameters commonly used in the literature. Based on results, the correction is shown to reduce contamination error to less than 10% of the dissolved-phase signal. Also, the method can be used to reduce dissolved phase signal heterogeneity in healthy human lungs using an IDEAL-based model, which has been used to reduce contamination error to less than 1% of the dissolved-phase signal.

Corresponding experiments in human subjects are consistent with increased individual and regional variation of TP- and RBC-to-gas ratios as predicted by the simulation experiments. Using the proposed correction, both mean and regional variation is reduced across the healthy normal subject population, suggesting more consistent quantitative measures following removal of the contamination. Unlike the simulated data, the human data is expected to present some degree of real physiologic variability such that the difference in the whole lung mean ratios following correction still reflect patient-specific differences, as illustrated in FIGS. 4A-4D. Importantly, regional standard deviation across the lung volume was significantly reduced after correction to reflect more homogeneous values as would be expected in a healthy normal population. In the IPF patient investigated, the expected regional variability due to disease was maintained after correction indicating the method does not affect disease-related heterogeneity.

Notably, the correction provided by the systems and methods provided herein can be implemented as a part of the standard 1-point Dixon HP 129Xe imaging methodology without changing important parameters, most notably TR, which is sufficiently long to allow both compartmental exchange of HP 129Xe to occur and acquisition at a second TE. The systems and methods provided herein facilitate practical flexibility to translate methods across sites, hardware manufacturer, and application, facilitating the methodological dissemination of dissolved-phase HP 129Xe MRI. Moreover, reducing the constraints on RF pulse performance opens up potential opportunities to optimize other acquisition design elements such as TE.

The system and methods provided herein assume that a negligible (technically zero) dissolved-phase signal is present in the data at $TE_2$. In one non-limiting example of $TE_2 \approx 4.2$ ms, gas contamination signal (in simulations) was reduced to approximately 10% of the dissolved-phase signal, which is generally below the noise floor for a typical human subject experiment (SNR typically >5). However, this amount of error could present a basis for further corrections or compensation in some applications. For example, to improve performance, either longer values of $TE_2$ may be used, or, as described above, the model may be extended to allow simultaneous estimation of the correction scale factor in the presence of dissolved-phase signal components. In this case, the gas contamination signal can be reduced to approximately 1% of the dissolved-phase signal.

Thus, systems and methods are provided for removing gas-phase contamination of dissolved-phase HP 129Xe MRI using a multiple echo acquisition. This technique is shown to be capable of significantly improving the reliability, consistency and accuracy of dissolved-phase HP 129Xe images in simulation experiments with similar behavior in human subject experiments. The system and method are designed to control the influence of suboptimal RF pulse behavior that can contribute to gas-phase excitation for multi-spectral acquisitions using HP 129Xe.

The systems and methods provided herein provide a useful diagnostic and monitoring technique for lung disorders such as COPD, Asthma, Fibrotic lung disease, radiation induced inflammation and emphysema, where understanding the ratio of gas exchange in tissue can provide useful clinical measures to diagnose and guide treatment.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for operating a magnetic resonance imaging (MRI) system to acquire images of a subject having received a hyperpolarized gas into airways, the method comprising:
    performing a pulse sequence including steps comprising:
        (i) for each effective repetition time ($TR_{eff}$), acquiring at least one gas-phase dataset and at least one dissolved-phase dataset, wherein a gas-phase echo time ($TE_{Gas}$) of the at least one gas-phase dataset and a dissolved-phase echo time ($TE_{Dissolved}$) of the at least one dissolved-phase dataset are selected to isolate gas-phase contamination of the dissolved-phase dataset from dissolved-phase components in the dissolved-phase dataset;
        (ii) estimating gas-phase contamination of the dissolved-phase dataset using the gas-phase dataset and a scaling factor ($\sigma$);
        (iii) producing a corrected dissolved-phase dataset by reducing the gas-phase contamination of the dissolved-phase dataset using the gas-phase contamination estimated in step (ii); and
    reconstructing an image of airspaces of the subject from the corrected dissolved-phase dataset and the gas-phase dataset.

2. The method of claim 1 wherein step (ii) further includes assuming that the gas-phase dataset is modulated by a known off-resonance frequency.

3. The method of claim 1 wherein step (ii) includes isolating the gas-phase contamination using a short $T_2^*$ of dissolved-phase components of the dissolved-phase dataset and compared to a long $T_2^*$ of gas-phase components of the dissolved-phase dataset.

4. The method of claim 1 wherein step (ii) includes isolating the gas-phase contamination using a differences in resonant frequencies and $T_2^*$ decay between the gas-phase dataset and components of the dissolved-phase dataset.

5. The method of claim 1 wherein the $TE_{Gas}$ and the $TE_{Dissolved}$ are selected for to differentiate a $T_2^*$ of gaseous xenon compared to dissolved xenon.

6. The method of claim 1 wherein step (i) includes acquiring a plurality of datasets at respective and successively longer echo times.

7. The method of claim 1 wherein step (i) includes a first echo time ($TE_1$) selected for the hyperpolarized gas and a second echo time ($TE_2$) that is a whole-number multiple of $TE_1$.

8. The method of claim 1 wherein $TE_2$ is selected to render signal from dissolved-phase components substantially negligible to signal from gas-phase components.

9. A magnetic resonance imaging (MRI) system, comprising:
    a magnet system configured to generate a static magnetic field about at least a portion of a subject arranged in the MRI system;

a gradient system configured to establish at least one magnetic gradient field with respect to the static magnetic field;

a radio frequency (RF) system configured to deliver excitation pulses to the subject and acquire imaging data from the subject;

a computer system programmed to:

control the gradient system and the RF system to perform a pulse sequence including steps comprising:
(i) for each effective repetition time ($TR_{eff}$), acquiring at least one gas-phase dataset and at least one dissolved-phase dataset, wherein a gas-phase echo time ($TE_{Gas}$) of the at least one gas-phase dataset and a dissolved-phase echo time ($TE_{Dissolved}$) of the at least one dissolved-phase dataset are selected to isolate gas-phase contamination of the dissolved-phase dataset from dissolved-phase components in the dissolved-phase dataset;
(ii) estimating gas-phase contamination of the dissolved-phase dataset using the gas-phase dataset and a scaling factor ($\sigma$);
(iii) producing a corrected dissolved-phase dataset by reducing the gas-phase contamination of the dissolved-phase dataset using the gas-phase contamination estimated in step (ii); and reconstruct an image of airspaces of the subject from the corrected dissolved-phase dataset and the gas-phase dataset.

10. The system of claim 9 wherein step (ii) further includes assuming that the gas-phase dataset is modulated by a known off-resonance frequency.

11. The system of claim 9 wherein step (ii) includes isolating the gas-phase contamination using a short T2* of dissolved-phase components of the dissolved-phase dataset and compared to a long T2* of gas-phase components of the dissolved-phase dataset.

12. The system of claim 9 wherein the $TE_{Gas}$ and $TE_{Dissolved}$ are selected for to differentiate a T2* of gaseous xenon compared to dissolved xenon.

13. The system of claim 9 wherein step (i) includes acquiring a plurality of datasets at respective and successively longer echo times.

14. The system of claim 9 wherein step (i) includes a first echo time ($TE_1$) selected for the hyperpolarized gas and a second echo time ($TE_2$) that is a whole-number multiple of $TE_1$.

15. The system of claim 9 wherein the computer system is further programmed to select $TE_2$ to render signal from dissolved-phase components substantially negligible to signal from gas-phase components.

16. A method for operating a magnetic resonance imaging (MRI) system to acquire images of a subject having received a hyperpolarized gas into airways, the method comprising:

performing a pulse sequence including steps comprising:
(i) acquiring at least one gas-phase dataset using a gas-phase echo time ($TE_{Gas}$);
(ii) acquiring a dissolved-phase dataset at a dissolved-phase echo time ($TE_{Dissolved}$) selected to isolate gas-phase contamination of the dissolved-phase dataset from dissolved-phase components in the dissolved-phase dataset;
(iii) repeating steps (i) and (ii) a plurality of times to complete the gas-phase dataset and the dissolved-phase dataset;
(iv) estimating gas-phase contamination of the dissolved-phase dataset using the gas-phase dataset and a scaling factor ($\sigma$);
(v) producing a corrected dissolved-phase dataset by reducing the gas-phase contamination of the dissolved-phase dataset using the gas-phase contamination estimated in step (iii); and reconstructing an image of airspaces of the subject from the corrected dissolved-phase dataset and the gas-phase dataset.

17. The method of claim 16 wherein the gas-phase dataset and the dissolved-phase dataset include off-resonance and on-resonance data.

18. The method of claim 16 wherein step (iv) includes isolating the gas-phase contamination using a short T2* of dissolved-phase components of the dissolved-phase dataset and compared to a long T2* of gas-phase components of the dissolved-phase dataset.

19. The method of claim 16 wherein the $TE_{Gas}$ and the $TE_{Dissolved}$ are selected for to differentiate a T2* of gaseous xenon compared to dissolved xenon.

20. The method of claim 16 wherein step (iii) repeating step (ii) respective and successively longer echo times.

21. The method of claim 16 wherein step (i) includes a first echo time ($TE_1$) selected for the hyperpolarized gas and wherein step (ii) includes a second echo time ($TE_2$) that is a whole-number multiple of $TE_1$.

22. The method of claim 16 wherein reconstructing an image includes utilizing one of a 1-point Dixon method or an iterative decomposition of water and fat with echo asymmetry and least-squares estimation (IDEAL) method.

* * * * *